United States Patent
Choi et al.

(10) Patent No.: US 11,905,445 B2
(45) Date of Patent: Feb. 20, 2024

(54) ORGANIC LUMINESCENT COMPLEX AND METHOD FOR MANUFACTURING ORGANIC LUMINESCENT COMPLEX

(71) Applicants: Institute for Basic Science, Daejeon (KR); POSTECH ACADEMY-INDUSTRY FOUNDATION, Gyeonsangbuk-Do (KR)

(72) Inventors: Hee Cheul Choi, Pohang-Si (KR); Jin Young Koo, Pohang-Si (KR); Minkyung Lee, Hwaseong-Si (KR)

(73) Assignees: POSTECH ACADEMY-INDUSTRY FOUNDATION, Gyeonsangbuk-do (KR); INSTITUTE FOR BASIC SCIENCE, Daejeon (KR)

( * ) Notice: Subject to any disclaimer, the term of this patent is extended or adjusted under 35 U.S.C. 154(b) by 766 days.

(21) Appl. No.: 16/963,824

(22) PCT Filed: Jan. 22, 2019

(86) PCT No.: PCT/KR2019/000929
§ 371 (c)(1),
(2) Date: Jul. 21, 2020

(87) PCT Pub. No.: WO2019/143230
PCT Pub. Date: Jul. 25, 2019

(65) Prior Publication Data
US 2021/0054267 A1     Feb. 25, 2021

(30) Foreign Application Priority Data

Jan. 22, 2018 (KR) .................. 10-2018-0007968

(51) Int. Cl.
*C09K 11/06* (2006.01)
*H10K 50/11* (2023.01)
(Continued)

(52) U.S. Cl.
CPC .............. *C09K 11/06* (2013.01); *H10K 85/40* (2023.02); *H10K 85/657* (2023.02)

(58) Field of Classification Search
CPC .............. H10K 85/657; H10K 85/656; C09K 2211/1037
See application file for complete search history.

(56) References Cited

U.S. PATENT DOCUMENTS

| | | |
|---|---|---|
| 8,431,046 B2 | 4/2013 | Zeika et al. |
| 9,570,686 B2 | 2/2017 | Heuser et al. |
(Continued)

FOREIGN PATENT DOCUMENTS

| | | |
|---|---|---|
| KR | 10-2007-0090214 A | 9/2007 |
| KR | 10-2009-0006111 A | 1/2009 |
| KR | 10-2012-0002946 A | 1/2012 |

OTHER PUBLICATIONS

Kong et al. (Kong, X.; Kulkarni, A.P.; Jenekhe, S.A., 2003, Phenothiazine-Based Conjugated Polymers: Synthesis, Electrochemistry, and Light-Emitting Properties, Macromolecules, 36, 8992-8999 (Year: 2003).*

(Continued)

*Primary Examiner* — Sean M DeGuire
*Assistant Examiner* — Rachel Simbana
(74) *Attorney, Agent, or Firm* — Harness, Dickey & Pierce, P.L.C.

(57) ABSTRACT

According to the present invention, an organic light-emitting composite and a method of manufacturing the organic light-emitting composite are provided. According to exemplary embodiments, an organic light-emitting composite includes a polymer matrix; a first light-emitting material provided in the polymer matrix; and a second light-emitting material provided in the polymer matrix and obtained by oxidizing the first light-emitting material, wherein the sec- (Continued)

ond light-emitting material may have the same molecular weight as that of the first light emitting-material.

13 Claims, 14 Drawing Sheets

(51) Int. Cl.
*H10K 50/125* (2023.01)
*H10K 71/00* (2023.01)
*H10K 85/40* (2023.01)
*H10K 85/60* (2023.01)

(56) References Cited

U.S. PATENT DOCUMENTS

| | | | |
|---|---|---|---|
| 2008/0018238 | A1 | 1/2008 | Gessner et al. |
| 2010/0308714 | A1* | 12/2010 | Gessner ............... C09B 23/141 544/35 |
| 2012/0001217 | A1 | 1/2012 | Kang et al. |
| 2016/0372687 | A1 | 12/2016 | Murer et al. |
| 2017/0166599 | A1 | 6/2017 | Abe et al. |

OTHER PUBLICATIONS

Shanmugam, R. et al., "An unusual electrochemical oxidation of phenothiazine dye to phenothiazine-bi-1,4-quinone derivative (a donor-acceptor type molecular hybrid) on MWCNT surface and its cysteine electrocatalytic oxidation function", Electrochimica Acta, 2016, vol. 187, pp. 34-45, p. 35, left column, line 13-right column, line 3; See schemes 1 and 2.

Lange, JJ et al., "Single-Molecule Studies of Oligomer Extraction and Uptake of Dyes in Poly(dimethylsiloxane) Films", Analytical Chemistry, 2009, vol. 81, pp. 10089-10096 pp. 10095, lines 49-52; See Figure 4.

Lee, M. et al., "Single-Component-Based White Light Photoluminescence Emission Via Selective Photooxidation in an Organic-Polymer hybrid System", Advanced Functional Materials, 2018 (Dec. 4, 2017, published electronically), vol. 28, No. 1703509, p. 1-7 See full literature.

Xiang, B. et al., "Photooxidation of Phenothiazine Derivatives in Silicas of Different Pore Sizes" American Chemical Society, Langmuir 1994, 10, 2688-2693.

International Search Report PCT/ISA/210 for International Application No. PCT/KR2019/000929 dated May 22, 2019.

Liu, P. et al., "Caulking polydimethylsiloxane molecular networks by thermal chemical vapor deposition of Parylene-C" The Royal Society of Chemistry, Lab Chip, 2016, 16, 4220-4229.

\* cited by examiner

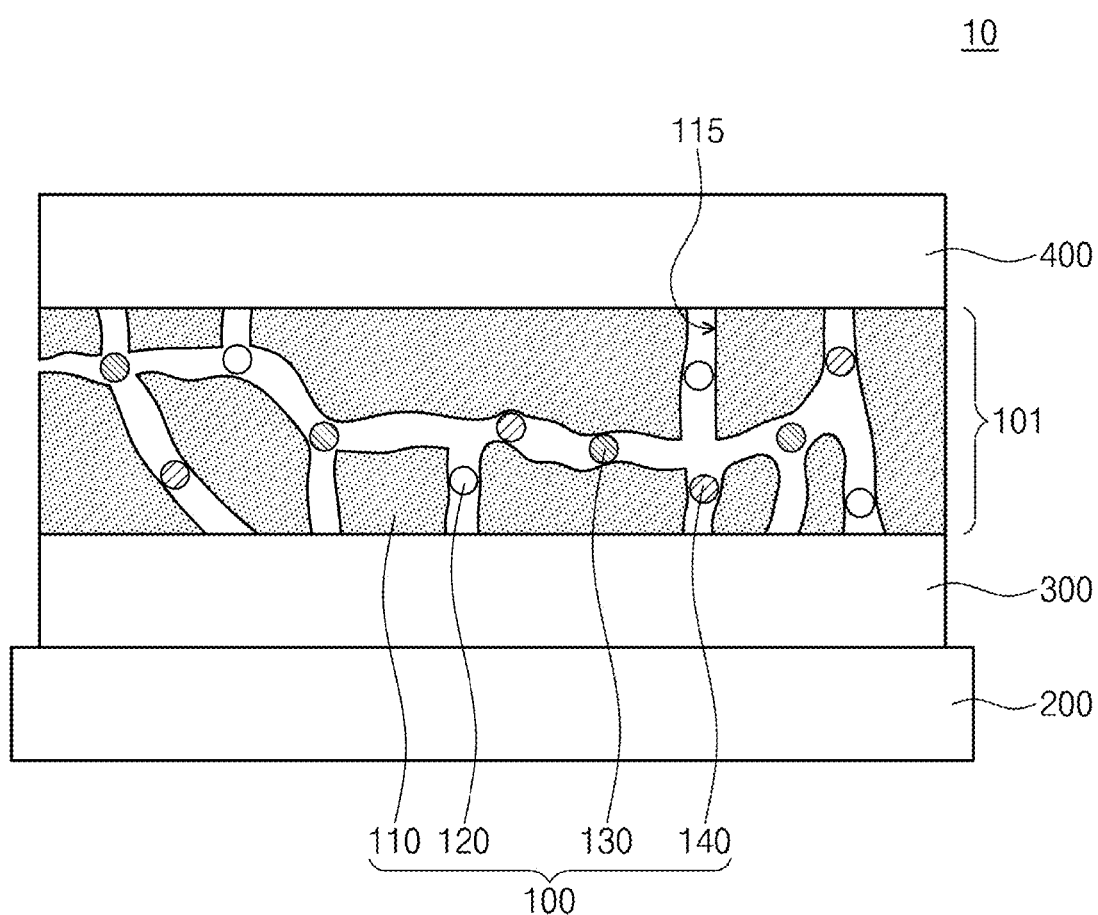

ORGANIC LUMINESCENT COMPLEX AND METHOD FOR MANUFACTURING ORGANIC LUMINESCENT COMPLEX

CROSS-REFERENCE TO RELATED APPLICATIONS

This U.S. non-provisional patent application claims priority under 35 U.S.C. § 119 of PCT Patent Application No. PCT/KR2019/000929, filed on Jan. 22, 2019 and Korean Patent Application No. 10-2018-0007968, filed on Jan. 22, 2018, the entire contents of which are hereby incorporated by reference.

TECHNICAL FIELD

The present invention disclosed herein relates to an organic light-emitting composite, and more particularly, to an organic light-emitting composite of an organic light-emitting device and a method of manufacturing the same.

BACKGROUND ART

In light-emitting devices, an organic light-emitting diode (OLED) receives attention as a core configuration element for accomplishing full color display. The organic light-emitting diode, particularly, a white organic light-emitting diode may have high efficiency, cost a little and have environmental sustainability. Polymer-based composite materials enable the manufacture of a large area with a low cost, and are promising materials for the application to the organic light-emitting diodes. The emitting layer of the organic light-emitting diode includes a multilayer including a red dye layer, a green dye layer, and a blue dye layer or a single layer including red dye, green dye, and blue dye, and shows white light. In this case, the red dye, green dye, and blue dye have different molecular structures from each other. However, a layer including different light-emitting dyes has the limitation of color disproportion due to the difference between energy transfer rates between dopants.

DISCLOSURE OF THE INVENTION

Technical Problem

The present invention provides an organic light-emitting composite emitting white light and an organic light-emitting device including the same.

The present invention also provides a method of simply manufacturing an organic light-emitting composite emitting white light.

Technical Solution

The present invention relates to an organic light-emitting composite and a method of manufacturing an organic light-emitting composite. The organic light-emitting composite according to the concept of the present invention includes: a polymer matrix; a first light-emitting material provided in the polymer matrix; and a second light-emitting material provided in the polymer matrix and obtained by oxidizing the first light-emitting material, wherein the second light-emitting material have the same molecular weight as that of the first light-emitting material.

According to exemplary embodiments, the second light-emitting material may include at least one among a radical cation of the first light-emitting material and a dication of the first light-emitting material.

According to exemplary embodiments, the first light-emitting material may emit light of a first wavelength, the radical cation of the first light-emitting material may emit light of a second wavelength which is different from the first wavelength, and the dication of the first light-emitting material may emit light of a third wavelength which is different from the first wavelength and the second wavelength.

According to exemplary embodiments, the first light-emitting material may have a neutral state.

According to exemplary embodiments, the polymer matrix may include a polymer containing a silicon atom, and the first light-emitting material may be represented by the following Formula 1:

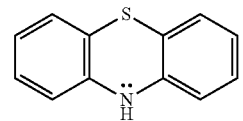

[Formula 1]

According to exemplary embodiments, the polymer matrix may include cavities therein, and the first light-emitting material and the second light-emitting material may be provided in the cavities of the polymer matrix.

A method of manufacturing an organic light-emitting composite according to the concept of the present invention includes: preparing a polymer matrix including cavities; supplying first light-emitting materials on the polymer matrix for the inflow of the first light-emitting materials into the cavities of the polymer matrix; and oxidizing some of the first light-emitting materials by irradiating light on the polymer matrix.

According to exemplary embodiments, the oxidizing some of the first light-emitting materials may include forming at least one among radical cations of the first light-emitting materials and dications of the first light-emitting materials.

According to exemplary embodiments, the radical cations of the first light-emitting materials may emit light having a wavelength different from those of the first light-emitting materials, and the dications of the first light-emitting materials may emit light having a wavelength different from those of the radical cations of the first light-emitting materials and those of the light-emitting materials.

According to exemplary embodiments, another some of the first light-emitting materials may be non-oxidized after the irradiating light on the first light-emitting materials.

According to exemplary embodiments, the irradiating light on the first light-emitting materials may be performed in the presence of an oxygen gas.

According to exemplary embodiments, the polymer matrix may include a silicon atom, and the first light-emitting materials may include phenothiazine.

According to exemplary embodiments, the supplying of the first light-emitting materials may include physical contact of the first light-emitting materials with the polymer matrix.

According to exemplary embodiments, the supplying of the first light-emitting materials on the polymer matrix may include supplying a disc containing the first light-emitting materials in a single crystalline state on the polymer matrix, and the first light-emitting materials may flow into the cavities of the polymer matrix as individual single molecules.

Advantageous Effects

According to the present invention, an organic light-emitting composite may include a light-emitting material and an oxidized light-emitting material. The organic light-emitting composite may include a single material and may emit uniform color. Since the oxidized light-emitting material is stabilized by a polymer matrix, the light-emitting reproducibility and reliability of the organic light-emitting composite may be improved.

An oxidized light-emitting material may be formed by irradiating light on a polymer matrix in which the light-emitting material is provided. Accordingly, an organic light-emitting composite may be simply manufactured. According to exemplary embodiments, a large-size organic light-emitting device may be easily manufactured.

BRIEF DESCRIPTION OF THE DRAWINGS

FIG. 5 is a cross-sectional view showing an organic light-emitting device according to exemplary embodiments.

MODE FOR CARRYING OUT THE INVENTION

Figure 1:
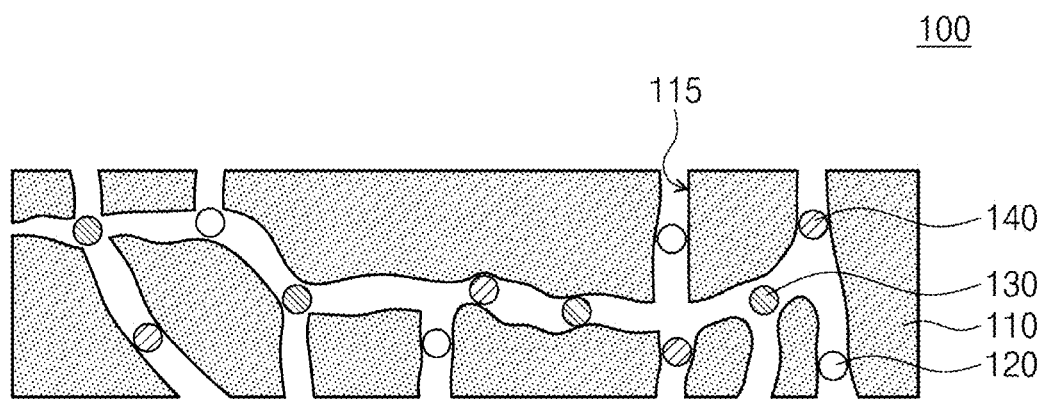
FIG. 1 is a cross-sectional view schematically showing an organic light-emitting composite according to exemplary embodiments.

Preferred embodiments of the present invention will be described with reference to the accompanying drawings for sufficient understanding of the configuration and effects of the present invention. The present invention may, however, be embodied in various forms and have various changes, and should not be constructed as limited to the embodiments set forth herein. Rather, these embodiments are provided so that this disclosure will be thorough and complete, and will fully convey the scope of the present invention to those skilled in the art. A person skilled in the art would understand that the concept of the present invention will be performed under certain suitable environments.

The terms used in the disclosure are used for explaining exemplary embodiments, but the present invention should not be limited by these terms. As used herein, the singular forms are intended to include the plural forms as well, unless the context indicates otherwise. The terms "comprises" and/or "comprising," when used in this specification, specify the presence of stated elements, steps, operations, and/or devices, but do not preclude the presence or addition of one or more other elements, steps, operations, and/or devices.

It will be understood that when a film (or layer) is referred to as being on another film (or layer), it can be directly formed on the other film (or layer) or a substrate, or a third intervening film (or layer) may be present.

In various exemplary embodiments in the disclosure, although the terms first, second, third, etc. may be used herein to describe various regions, films (or layers), etc., these regions and films should not be limited by these terms. These terms are only used to distinguish one region or film (or layer) from another region or film (or layer). Thus, a first layer material referred to in an embodiment could be termed a second layer material in another embodiment. Embodiments explained and illustrated herein may include their complementary embodiments. In the description, parts designated by the same reference numerals refer to the same configuration elements throughout.

Unless otherwise defined, all terms used herein have the same meaning as commonly understood by one of ordinary skill in the art to which this invention belongs.

In the description, like reference numerals refer to like elements throughout.

Hereinafter, an organic light-emitting composite and a method of manufacturing the same according to the concept of the present invention, and an organic light-emitting device including the organic light-emitting composite will be explained.

FIG. 1 is a cross-sectional view schematically showing an organic light-emitting composite according to exemplary embodiments.

Referring to FIG. 1, an organic light-emitting composite (100) may include a polymer matrix (110), a light-emitting material (120), and oxidized light-emitting materials (130, 140). The polymer matrix (110) may have cavities (115). The polymer matrix (110) may be a polymer including silicon atoms. The polymer matrix (110) may include, for example, poly(dimethylsiloxane) (hereinafter, PDMS), but is not limited thereto. The polymer matrix (110) may be flexible.

The light-emitting material (120) may be provided in the cavities (115) of the polymer matrix (110). The light-emitting material (120) may be provided as single molecules. The light-emitting material (120) may have a neutral state. The light-emitting material (120) may emit light of a first wavelength. The light emission of the light-emitting material (120) may correspond to photoluminescence, but is not limited thereto. According to an embodiment, the first wavelength may emit light of 400 nm to 500 nm. For example, the first wavelength may emit light of 450 nm. The light-emitting material (120) may include an aromatic compound. The aromatic compound may mean a ring compound having a conjugation structure. The aromatic compound may be a heterocyclic compound. The light-emitting material (120) may include a heteroatom (for example, a nitrogen atom and/or a sulfur atom) and have lone pair electrons. According to exemplary embodiments, the light-emitting material (120) may be phenothiazine represented by the following Formula 1:

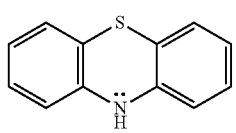

[Formula 1]

In another embodiment, the light-emitting material (120) may be any one among the materials represented in the following Formula 2:

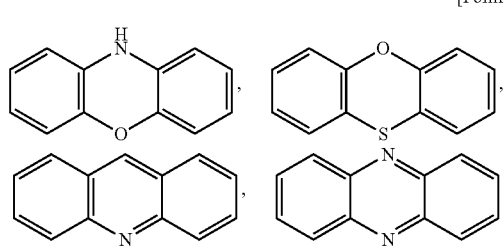

[Formula 2]

According to exemplary embodiments, the light-emitting material (120) may have relatively low ionization energy. The light-emitting material (120) may have ionization energy of 7 eV or less (for example, 6.73 eV).

The oxidized light-emitting materials (130, 140) may be provided in the cavities (115) of the polymer matrix (110) as single molecules. Each of the oxidized light-emitting materials (130, 140) may be obtained by the photooxidation of the light-emitting material (120). The oxidized light-emitting materials (130, 140) may include the same elements as the light-emitting material (120), and the oxidized light-emitting materials (130, 140) may have the same atomic ratio as the light-emitting material (120). The oxidized light-emitting materials (130, 140) may have the same molecular weight as the light-emitting material (120). The oxidized light-emitting materials (130, 140) may include at least one among the radical cation (130) of the light-emitting material and the dication (140) of the light-emitting material. The radical cation (130) of the light-emitting material may emit light of a second wavelength. The second wavelength may be different from the first wavelength. The second wavelength may be, for example, 500 nm to 800 nm. The color shown by the radical cation (130) of the light-emitting material may be different from the color shown by the light-emitting material (120). The dication (140) of the light-emitting material may emit light of a third wavelength. The third wavelength may be different from the first wavelength and the second wavelength. The third wavelength may be, for example, 500 nm to 800 nm, but may be different from the second wavelength. The color shown by the dication (140) of the light-emitting material may be different from the color shown by the light-emitting material (120) and the color shown by the radical cation (130) of the light-emitting material. According to exemplary embodiments, the polymer matrix (110) may play the role of an electron acceptor and may stabilize the oxidized light-emitting materials (130, 140). For example, the silicon atom of the polymer matrix (110) may interact with the oxidized light-emitting materials (130, 140). Different from the drawing, any one among the radical cation (130) of the light-emitting material and the dication (140) of the light-emitting material may be omitted.

The organic light-emitting composite (100) may emit mixed light of the light of the first wavelength, the light of the second wavelength, and the light of the third wavelength. According to an embodiment, the mixed light may be white light. For example, the mixed light may emit light corresponding to a color coordinate of International Commission on Illumination (hereinafter, CIE) of (0.33, 0.33) to (0.34, 0.32). For example, according to the control of the type of the light-emitting material (120), the color of the mixed light may be controlled. In another embodiment, the composition ratio of the light-emitting material (120), the radical cation (130) of the light-emitting material, and the dication (140) of the light-emitting material may be controlled to control the color of the mixed light. According to exemplary embodiments, the polymer matrix (110) may stabilize the oxidized light-emitting materials (130, 140), and the organic light-emitting composite (100) may emit mixed light having uniform color and uniform intensity according to time.

Figure 2:
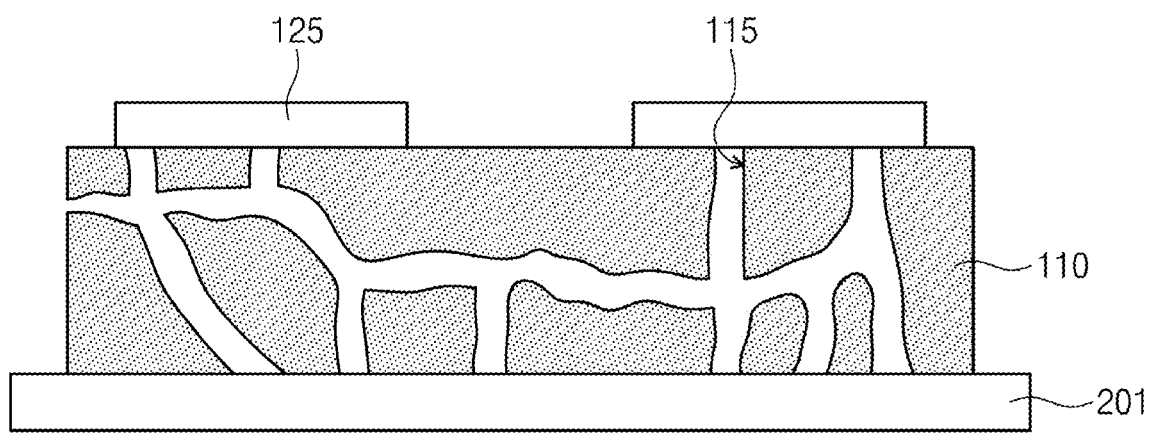
FIGS. 2 to 4 are cross-sectional views for explaining a method of manufacturing an organic light-emitting composite according to exemplary embodiments.
Figure 3:
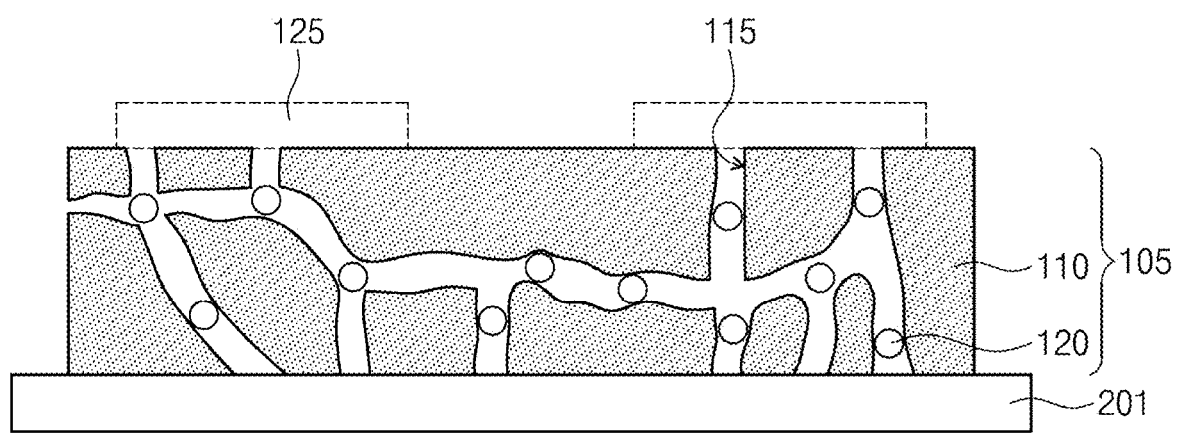
Figure 4:
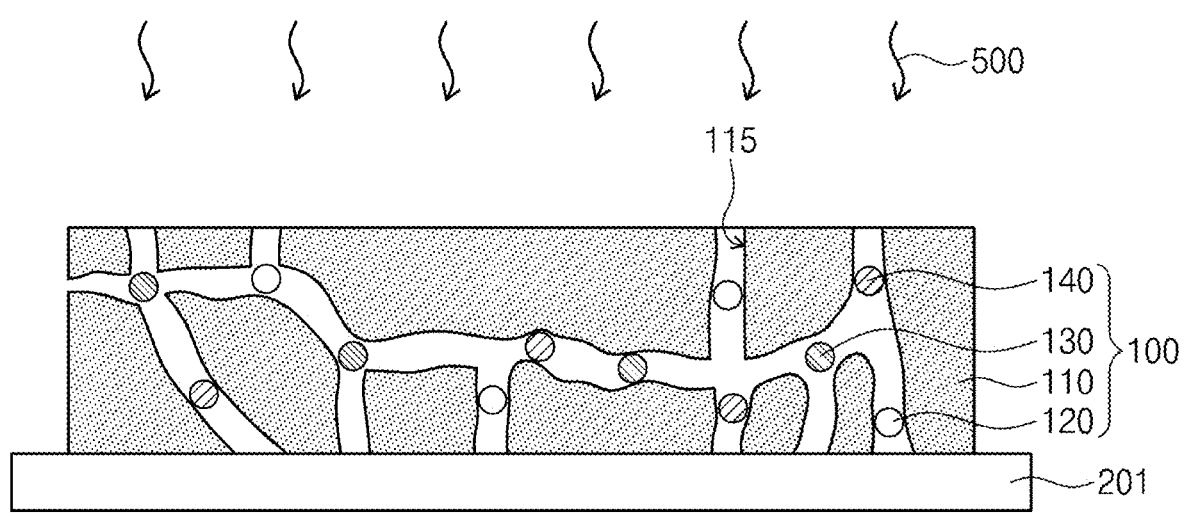

FIGS. 2 to 4 are cross-sectional views for explaining a method of manufacturing an organic light-emitting composite according to exemplary embodiments. Hereinafter, contents overlapped with the above explanation will be omitted.

Referring to FIG. 2, a polymer matrix (110) may be prepared. The polymer matrix (110) may be disposed on a temporary substrate (201). A light-emitting material disc (125) may be provided on the polymer matrix (110). The polymer matrix (110) may be substantially the same as the polymer matrix (110) explained in FIG. 1. The light-emitting material disc (125) may include a light-emitting material in a single crystalline state. The light-emitting material disc (125) may include a plurality of light-emitting materials. Each of the light-emitting materials may include the same material described in the embodiments of the light-emitting material (120) in FIG. 1. The light-emitting material disc (125) may make physical contact with the polymer matrix (110).

Referring to FIG. 3, the light-emitting materials (120) in the light-emitting disc (125) may be provided in the cavities (115) of the polymer matrix (110) to prepare a preliminary composite (105). According to exemplary embodiments, by the physical contact of the light-emitting material disc (125) and the polymer matrix (110), bonds between the light-emitting materials (120) in the light-emitting material disc (125) may be broken, and the light-emitting materials (120) may voluntarily enter into the cavities (115) of the polymer matrix (110) as an individual single molecule state. The light-emitting materials (120) may enter into the cavities (115), for example, by diffusion. In this case, an additional treating process may not be performed on the polymer matrix (110) and the light-emitting material disc (125). The inflow of the light-emitting materials (120) into the cavities (115) of the polymer matrix (110) may be determined according to the type of the light-emitting materials (120), the size of the light-emitting materials (120), and the size of the cavities (115) of the polymer matrix (110). Here, the size of the light-emitting materials (120) means the maximum size (for example, the maximum diameter) of the single molecules of the light-emitting materials (120). According to exemplary embodiments, by controlling the size of the light-emitting materials (120) used and the size of the cavities (115) of the polymer matrix (110), the light-emitting materials (120) may spontaneously enter into the cavities (115) of the polymer matrix (110). The size of the light-emitting materials (120) may be from 3 Å to 9 Å. In detail, the size of the light-emitting materials (120) may be from 8 Å to 9 Å. The size of each of the cavities (115) of the matrix (110) may be from 1 Å to 11 Å. An average size of the cavities (115) of the matrix (110) may be from 9 Å to 11 Å. The time consumed for completing the inflow of the light-emitting materials (120) into the polymer matrix (110) may be changed according to the volume of the light-emitting material disc (125).

Referring to FIG. 4, light (500) is irradiated on the preliminary composite (105), for example, the polymer matrix (110) of the preliminary composite (105) to form oxidized light-emitting materials (130, 140). The light (500) may be ultraviolet rays, but is not limited thereto. For example, the light (500) may have a wavelength of 365 nm or a wavelength longer than 365 nm. If the light (500) is irradiated on the polymer matrix (110), at least some of the light-emitting materials (120) may be oxidized. Accordingly, the oxidized light-emitting materials (130, 140) may be formed. The oxidized light-emitting materials (130, 140) may include at least one among the radical cations (130) of the light-emitting materials and the dications (140) of the light-emitting materials.

After irradiating the light (500), another some of the light-emitting materials (120) may be non-oxidized but remain. Accordingly, the organic light-emitting composite (100) explained in FIG. 1 may be prepared. The organic light-emitting composite (100) includes the polymer matrix (110), the light-emitting materials (120), and the oxidized light-emitting materials (130, 140), and the oxidized light-emitting materials (130, 140) may include at least one among the radical cations (130) of the light-emitting materials and the dications (140) of the light-emitting materials. According to the irradiation time of the light (500), the ratio of the light-emitting materials (120), the radical cations (130) of the light-emitting materials, and the dications (140) of the light-emitting materials may be controlled. Accordingly, the color of light emitted by the organic light-emitting composite (100) may be changed. According to exemplary embodiments, by the control of the irradiation time of the light (500), the organic light-emitting composite (100) may emit white light. According to exemplary embodiments, the irradiation of the light (500) may be performed in the presence of an oxygen gas. For example, the light irradiation may be performed in temperature conditions of 330 K in the air. During irradiating the light (500), the oxygen gas may be supplied in a partial pressure of 20% to 25% of the atmospheric pressure (for example, 76 mmHg). After that, the temporary substrate (201) may be removed.

FIG. 5 is a cross-sectional view showing an organic light-emitting device according to exemplary embodiments. Hereinafter, contents overlapped with the above explanation will be omitted.

An organic light-emitting device 10 may include a substrate (100), a first electrode (300), an emitting layer (101), and a second electrode (400). The substrate (200) may include an organic material and an inorganic material. The substrate (200) may be transparent, but is not limited thereto.

The first electrode (300) may be provided on the substrate (200). The first electrode (300) may include a transparent conductive oxide. In another embodiment, the first electrode (300) may include a metal to reflect light.

The second electrode (400) may be disposed on the first electrode (300). In an embodiment, the second electrode (400) may include a metal and reflect light. In another embodiment, the second electrode (400) may include a transparent conductive oxide. The second electrode (400) may be electrically connected with the first electrode (300) via a conductive line.

The emitting layer (101) may be provided between the first electrode (300) and the second electrode (400). The emitting layer (101) may include the organic light-emitting composite (100). The organic light-emitting composite (100) may be substantially the same as that explained in FIG. 1. For example, the organic light-emitting composite (100) may include a polymer matrix (110), a light-emitting materials (120), and oxidized light-emitting materials (130, 140). The oxidized light-emitting materials (130, 140) may include at least one among the radical cation (130) of the light-emitting material and the dication (140) of the light-emitting material. By providing the organic light-emitting composite (100) manufactured as in FIG. 2 to FIG. 4 between the first electrode (300) and the second electrode (400), the emitting layer (101) may be formed. Accordingly, the manufacturing process of the emitting layer (101) may be simplified.

Hereinafter, referring to Experimental Examples and Comparative Examples of the present invention, the manufacture and evaluation of an organic light-emitting composite will be explained.

[Manufacture of Organic Light-Emitting Composite]

(Experimental Example 1-1) Formation of Light-Emitting Material Disc

At the center of a furnace, 50 g of a phenothiazine (hereinafter, PTZ) powder was positioned, a silicon substrate for collecting a product was positioned at the end of the downstream of the furnace, and physical vapor transport was performed. The PTZ powder was purchased from Sigma-Aldrich Co. The vapor temperature measured near the PTZ powder was 180° C., and the temperature measured near the silicon substrate was 40° C. The growth of the PTZ was carried out for 15 minutes after the furnace reached 180° C. After finishing the PTZ growth, a single crystalline PTZ disc was obtained.

(Experimental Example 1-2) Preparation of Polymer Matrix

By mixing a catalyst and a silicon oligomer in a weight ratio of 1:10, a mixture was prepared. The mixture was purged for 30 minutes, and a trapped gas from the mixture was removed. The purged mixture was annealed in vacuum conditions at a temperature of 60° C. for 1 hour to prepare polydimethylsiloxane (hereinafter, PDMS).

(Experimental Example 1-3) Manufacture of Preliminary Composite

The PTZ of Experimental Example 1-1 was brought into contact on the PDMS of Experimental Example 1-2 by a stamping method and left until the PTZ entered into the PDMS. After that, the residue of the PTZ disc was removed using isopropyl alcohol, and the PTZ disc was dried using a nitrogen gas to prepare a preliminary composite.

(Experimental Example 1-4) Manufacture of Organic Light-Emitting Composite

Light irradiation in a ultraviolet (hereinafter, UV) region was emitted on the PDMS layer of the organic light-emitting composite at 0.01 mW/cm$^2$. In this case, light of 365 nm was used. The light irradiation was performed in the presence of an oxygen gas in temperature conditions of 330K. The light irradiation was performed using an ENF-240C FE apparatus.

(Experimental Example 1-5) Analysis of Photoluminescence Spectroscopy

The photoluminescence spectrum of Experimental Example 1-3 was obtained using a fluorescence microscope equipped with a fluorescence filter ($\lambda$ex=330-380 nm, $\lambda$em=420 nm long path filter). Data was processed using ChromaticityPlot in a CIE 1931 color space, and CIE color coordinate of the photoluminescence spectrum was obtained.

[Evaluation of Organic Light-Emitting Composite]

Figure 6A:
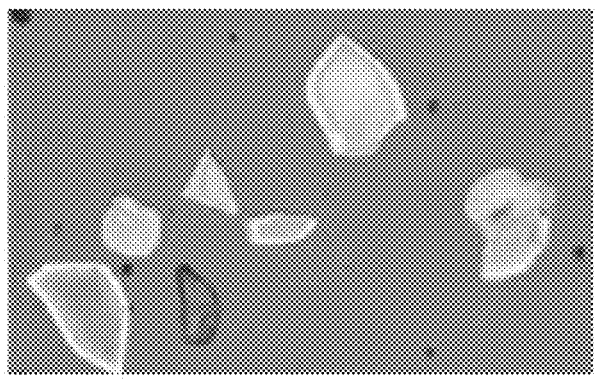
FIG. 6A is a photographic image observed by an optical microscope immediately after contacting Experimental Example 1-3 with a polymer matrix.
Figure 6B:
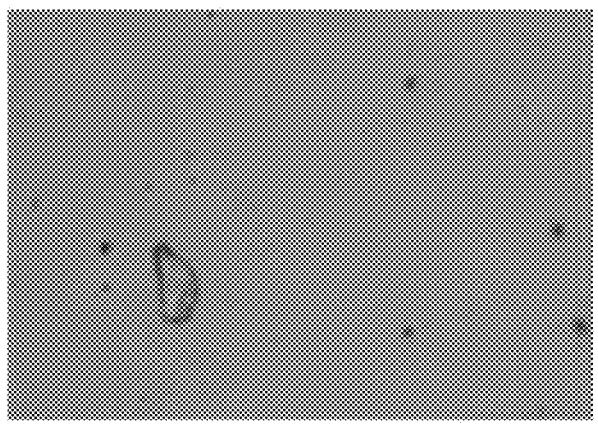
FIG. 6B is a photographic image on Experimental Example 1 observed by an optical microscope after 20 minutes from the contact of Experimental Example 1-3 with a polymer matrix.

FIG. 6A is a photographic image observed by an optical microscope immediately after contacting Experimental Examples 1-3 with a polymer matrix. FIG. 6B is a photographic image on Experimental Example 1 observed by an optical microscope after 20 minutes from the contact of Experimental Examples 1-3 with a polymer matrix.

Referring to FIG. 6A, after the light-emitting material of Experimental Example 1 was brought into contact with the polymer matrix, a single crystalline light-emitting material (PTZ) disc was observed. Referring to FIG. 6B, the single crystalline light-emitting material (PTZ) disc did not remain on the polymer matrix.

Figure 7A:
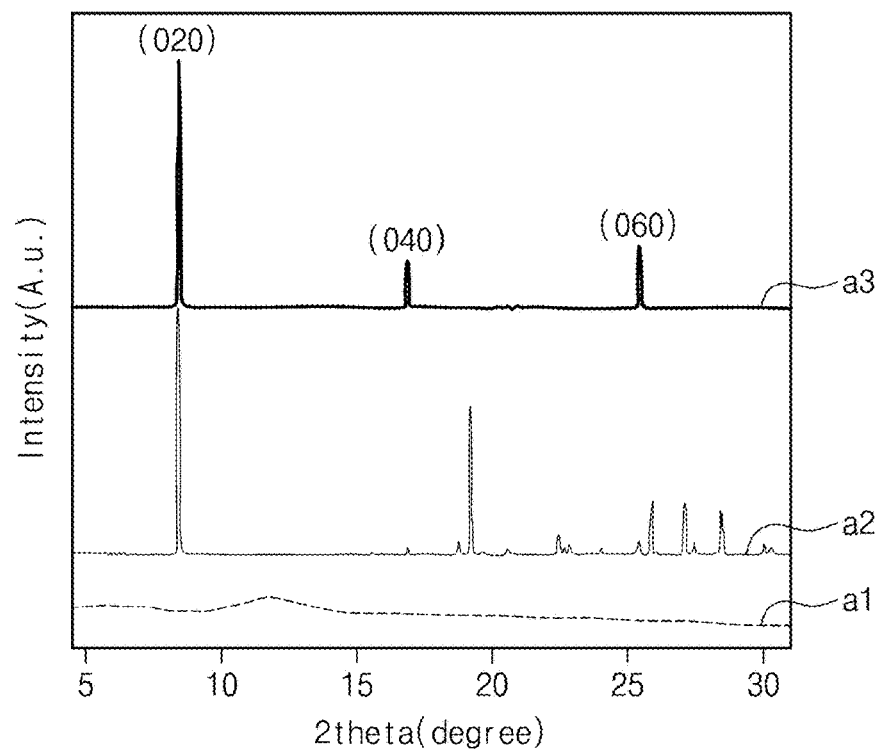
FIG. 7A shows XRD measurement results of the peaks of a PTZ disc and PTZ powder on a polymer matrix.

FIG. 7A shows XRD measurement results of a PTZ disc and PTZ powder on a polymer matrix. In FIG. 7A, a1 and a2 are XRD measurement results on the peaks of pure PDMS (Experimental Example 1-2) and PTZ powder, respectively. a3 is XRD measurement results of a specimen (Experimental Example 1-3) obtained by positioning the PTZ disc of Experimental Example 1-1 on the PDMS of Experimental Example 1-2.

Referring to FIG. 7A, the peaks of a crystal face were not observed for the pure PDMS of Experimental Example 1-2 (a1). The (020) face, (040) face, and (060) face of a single crystal were observed for the PTZ powder (a2). The (020) face, (040) face, and (060) face of the single crystal of the light-emitting material were observed for the PTZ disc (a3) on the polymer matrix. It could be found that the light-emitting material disc provided on one face of the polymer matrix has a single crystalline structure.

Figure 7B:
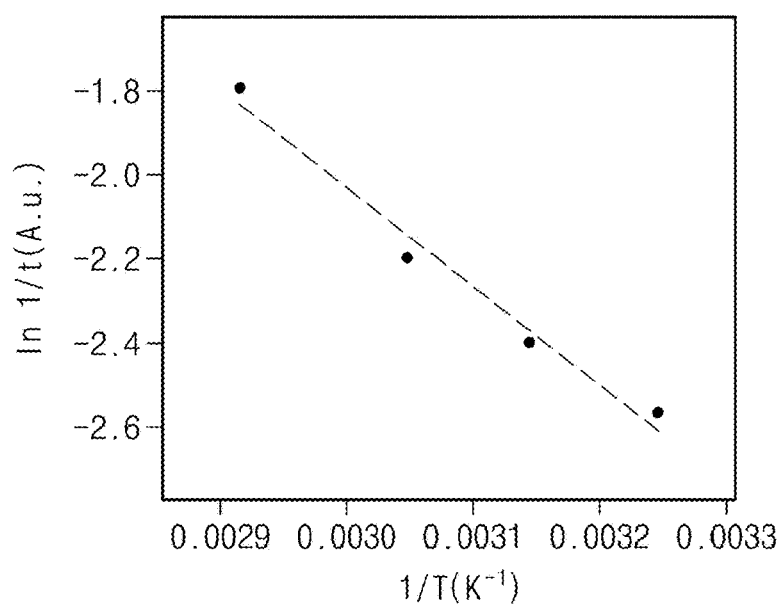
FIG. 7B is a graph for analyzing activation energy required for diffusing a light-emitting material disc into a polymer matrix.

FIG. 7B is a graph for analyzing activation energy required for diffusing a light-emitting material disc into a polymer matrix. In FIG. 7B, the axis of abscissa represents the reciprocal of absolute temperature. The axis of ordinate represents ln(1/t), where t is time consumed for completing the inflow of the light-emitting material disc into the polymer matrix. The inflow completion time was measured at a point when the light-emitting material disc did not remain on the polymer matrix using a microscope. The PTZ disc of Experimental Example 1-1 was used as the light-emitting material disc. Experimental Example 1-2 was used as the polymer matrix. The diffusion of the light-emitting material disc was measured at temperature conditions of 35° C., 45° C., 55° C., and 70° C., respectively.

Referring to FIG. 7B, the diffusion activation energy of the light-emitting material disc was calculated as approximately −19 KJ/mol. Here, the diffusion activation energy of the light-emitting material (hereinafter, diffusion activation energy) means activation energy required for diffusing the light-emitting material disc into the polymer matrix. The diffusion activation energy has a relatively small value. For example, the diffusion activation energy is lower than the activation energy for diffusing a solid into a solid. It could be found that due to the low diffusion activation energy, the light-emitting material disc may be easily diffused into the polymer matrix.

Table 1 shows evaluation results on whether or not a light-emitting material flows into a polymer matrix in accordance with the type of a polymer. After bringing the single crystalline PTZ formed as in Experimental Example 1-1 into contact with the polymer matrix, whether or not the PTZ flows into the polymer matrix was observed. Comparative Example 1-1 and Comparative Example 1-2 used polymethyl methacrylate (hereinafter, PMMA) and polyethylene terephthalate (hereinafter, PET) as polymer matrixes, respectively. The inflow of the light-emitting material was observed using an optical microscope.

TABLE 1

|  | Polymer type | Inflow into polymer matrix |
| --- | --- | --- |
| Comparative Example 1-1 | PET | X |
| Comparative Example 1-2 | PMMA | X |
| Experimental Example 1-3 | PDMS | ○ |

Referring to Table 1, the light-emitting material (PTZ) flew into PDMS, but did not flow into PET and PMMA. From the results, it could be found that the PTZ disc interacted with PDMS but did not interact with PET and PMMA.

Table 2 shows evaluation results on the inflow or not into a polymer matrix according to a light-emitting material. After bringing the single crystalline PTZ formed as in Experimental Example 1-3 into contact with the polymer matrix, the inflow or not of the PTZ into the polymer matrix was observed. Preliminary composites were manufactured by the same method as in Experimental Example 1-3 except for using anthracene, tetracene, and pentacene as light-emitting materials in Comparative Example 2-1, Comparative Example 2-2 and Comparative Example 2-3, respectively.

The inflow or not of the light-emitting material was observed using an optical microscope.

In addition, the residues of the light-emitting material discs of Comparative Examples 2-1 to 2-3 and Experimental Example 1-3 were removed using isopropyl alcohol. Then, by measuring PL spectrum, the inflow or not of the light-emitting materials into the polymer matrix was evaluated through the measurement of the peaks of the light-emitting materials.

TABLE 2

|  | Light-emitting material type | Inflow into PDMS matrix | |
|---|---|---|---|
|  |  | Observation results using optical microscope | PL spectrum analysis results |
| Comparative Example 2-1 | Anthracene | ○ | ○ |
| Comparative Example 2-2 | Tetracene | X | X |
| Comparative Example 2-3 | Pentacene | X | X |
| Experimental Example 1-3 | PTZ | ○ | ○ |

Referring to Table 2, in Comparative Example 2-1 and Experimental Example 1-3, the light-emitting materials entered into the PDMS matrix. In Comparative Examples 2-2 and 2-3, the inflow into the PDMS matrix did not occur. An anthracene single molecule and a PTZ single molecule have a smaller size than a tetracene single molecule and a pentacene single molecule. From this, it could be found that the inflow into the polymer matrix is determined according to the size of the single molecule of the light-emitting material.

Comparative Example 3

Light irradiation was emitted on a preliminary composite by the same method as in Experimental Example 1-4. However, ultraviolet (hereinafter, UV) irradiation was performed in a nitrogen gas without an oxygen gas.

Table 3 shows observation results on colors with the naked eye before and after UV irradiation of Comparative Example 3 and Experimental Example 1-4.

TABLE 3

|  | Color before UV irradiation | Color after UV irradiation | Color change before and after UV irradiation |
|---|---|---|---|
| Comparative Example 3 | transparent | transparent | X |
| Experimental Example 1-4 | transparent | red | ○ |

Referring to Table 3, in Comparative Example 3, there was no color change before and after the UV irradiation. In Experimental Example 1-4, the organic light-emitting composite changed into red after UV irradiation.

Figure 8A:
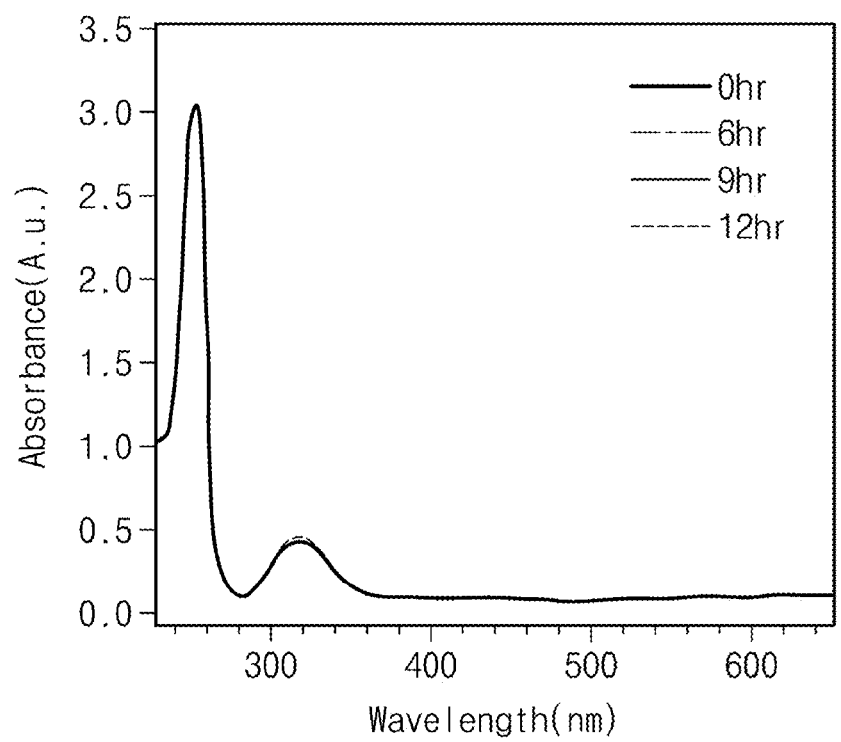
FIG. 8A is a graph showing measurement results of absorbance according to UV irradiation time of Comparative Example 3.

FIG. 8A is a graph showing measurement results of absorbance according to UV irradiation time of Comparative Example 3.

Referring to FIG. 8A, in Comparative Example 3, there was no absorbance change according to the UV irradiation time.

Figure 8B:
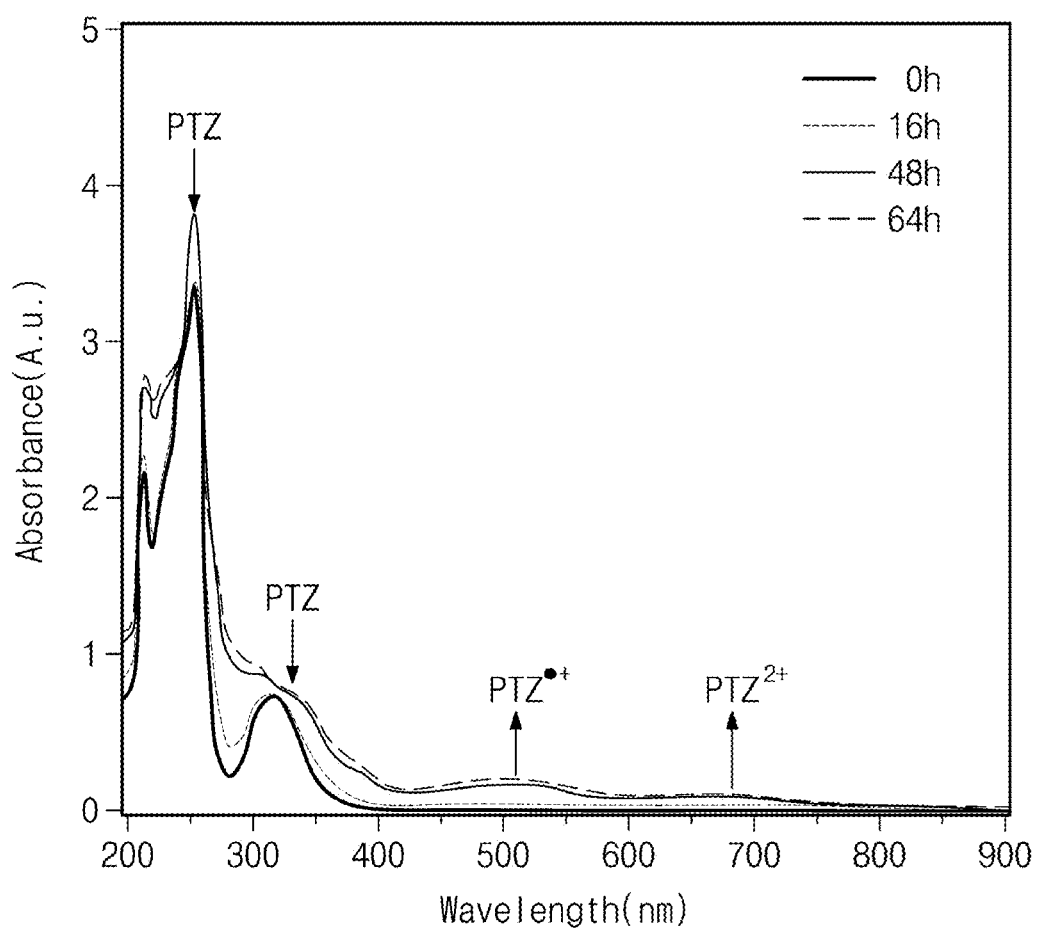
FIG. 8B is a graph showing measurement results of absorbance according to UV irradiation time of Experimental Example 1-4.
Figure 8C:
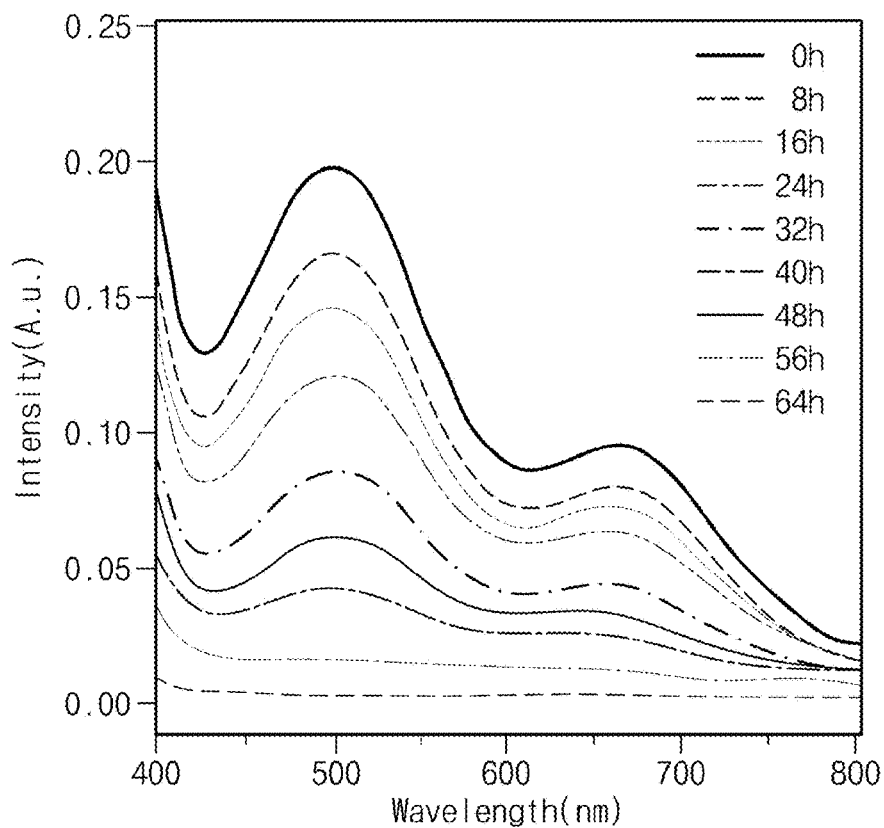
FIG. 8C is a graph showing measurement results of absorbance according to time of Experimental Example 1-4 in more detail.

FIG. 8B is a graph showing measurement results of absorbance according to UV irradiation time of Experimental Example 1-4. FIG. 8C is a graph showing measurement results of absorbance according to time of Experimental Example 1-4 in more detail. In FIG. 8C, x-axis represents for 400 nm to 800 nm, and the results are for the UV irradiation for 0 hours, 8 hours, 16 hours, 24 hours, 32 hours, 40 hours, 48 hours, 56 hours, and 64 hours.

Referring to FIG. 8B and FIG. 8C, the organic light-emitting composite before UV irradiation showed sharp peaks (PTZ) at 210 nm, 252 nm, and 218 nm. The peaks of 210 nm, 252 nm, and 218 nm correspond to neutral PTZ peaks (PTZ). After light irradiation, broad peaks (PTZ$^{•+}$, PTZ$^{2+}$) were newly observed at 504 nm, 670 nm, and 390 nm. The peaks of 504 nm, 670 nm, and 390 nm correspond to the peaks of PTZ radical cation (PTZ$^{•+}$) or the peaks of PTZ dication (PTZ$^{2+}$).

Figure 8D:
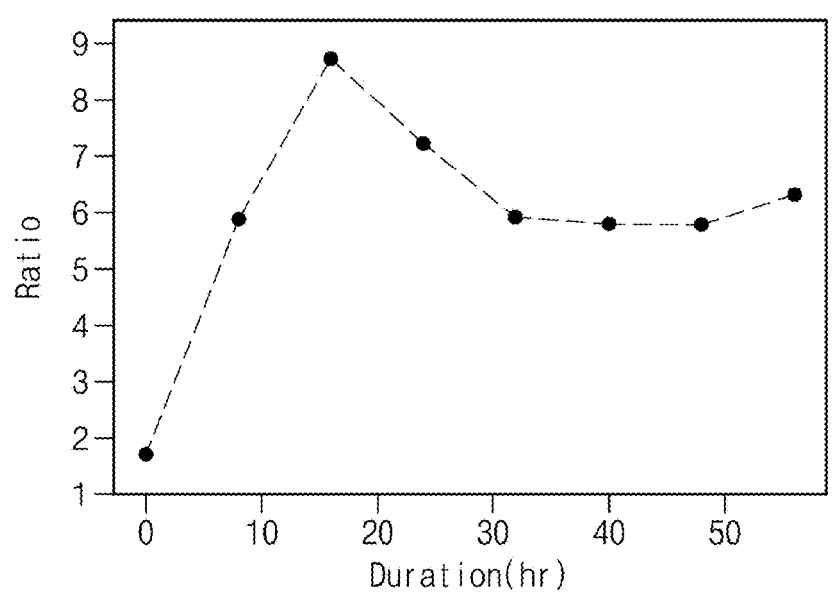
FIG. 8D is an analysis graph on the stability of the organic light-emitting composite of Experimental Example 1-4.

FIG. 8D is a graph analyzing the stability of the organic light-emitting composite of Experimental Example 1-4. In FIG. 8D, the axis of abscissa represents the duration time of UV irradiation, and the axis of ordinate represents the ratio of the absorbance intensity of radical cation with respect to the absorbance intensity of dication. Hereinafter, for the abbreviation of explanation of FIG. 8D, "the ratio of the absorbance intensity of radical cation with respect to the absorbance intensity of dication" will be described as "the ratio of radical cation with respect to dication".

Referring to FIG. 8D, if the duration time of UV irradiation is less than about 20 hours, the ratio of radical cation with respect to dication increases according to the increase of the duration time of UV irradiation. This is considered because an oxidized light-emitting material (radical cation and dication) is formed. If the duration time of UV irradiation is about 30 hours or more, the ratio of radical cation with respect to dication is constant irrespective of the duration time of UV irradiation. From the results, it could be found that if the duration time of UV irradiation is long, the oxidized light-emitting material has stability. According to exemplary embodiments, the organic light-emitting composite may stably emit mixed light (for example, white light).

Figure 9:
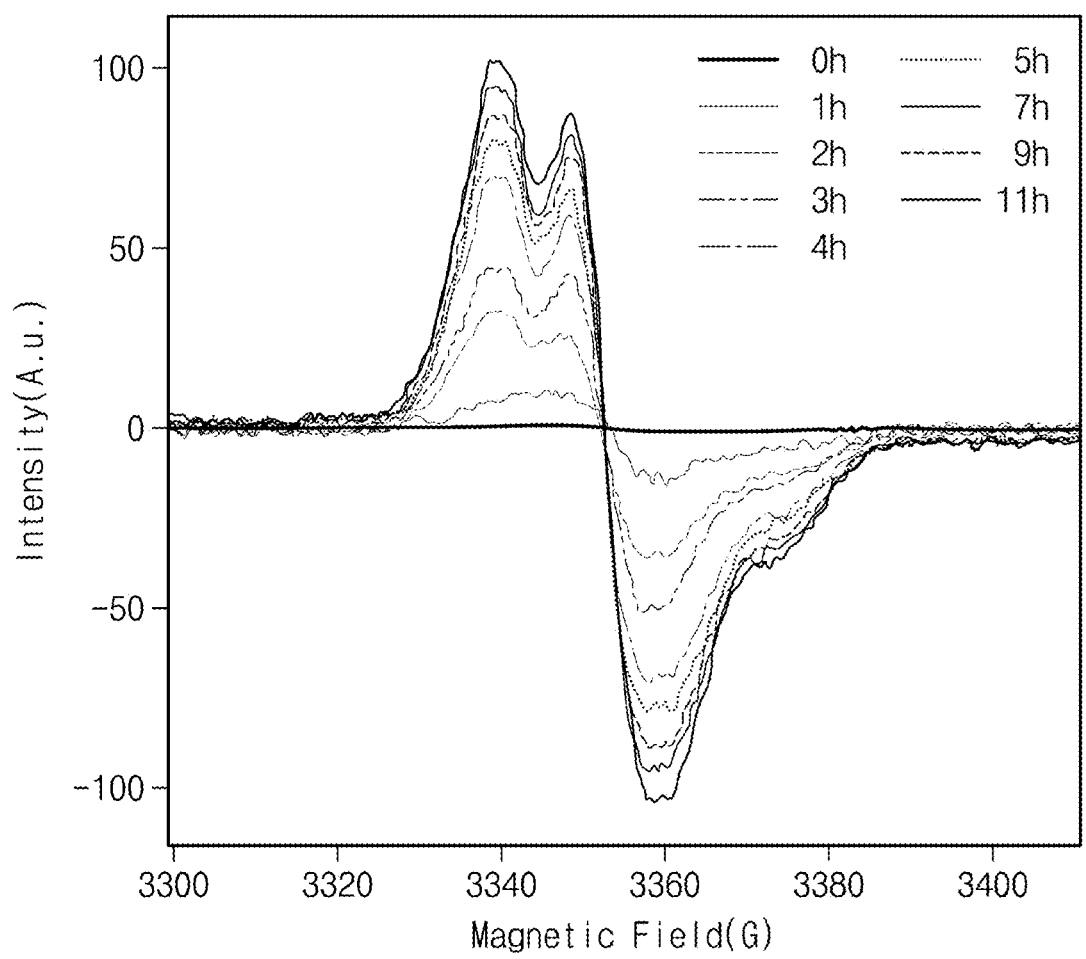
FIG. 9 is electron spin resonance (ESR) analysis results according to UV irradiation time of Experimental Example 1-4.

FIG. 9 is electron spin resonance (ESR) analysis results according to UV irradiation time of Experimental Example 1-4.

Referring to FIG. 9, the peaks of PTZ radical cation were observed. In case where the UV irradiation time increased, the intensity of the peaks of the PTZ radical cation increased.

Figure 10:
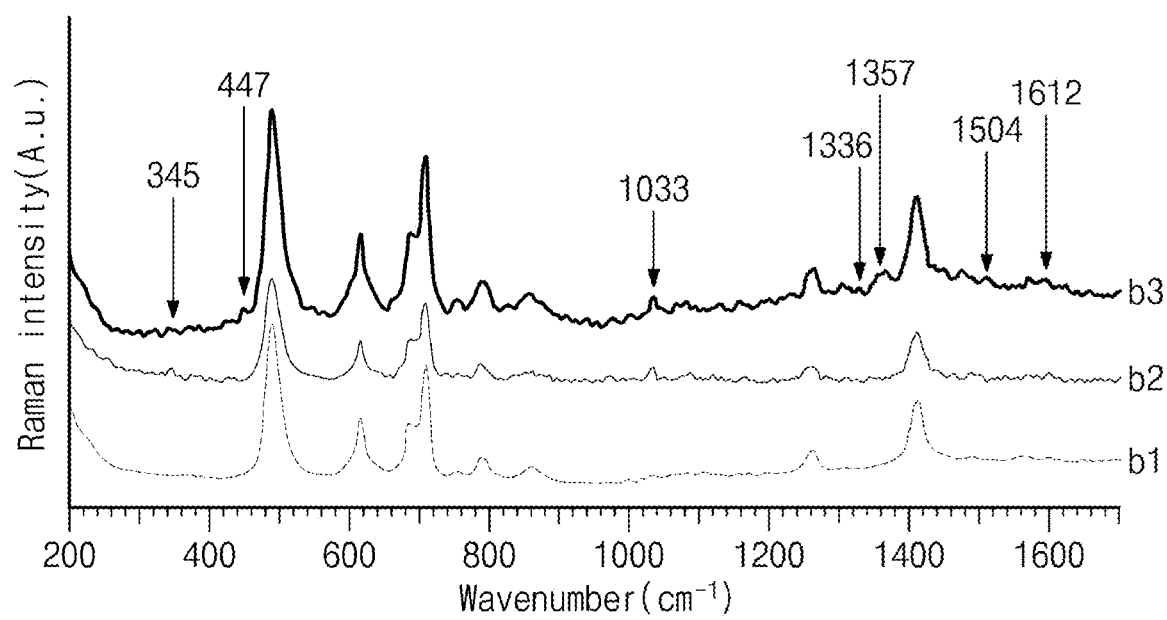
FIG. 10 shows FR-Raman spectrum analysis results of Experimental Example 1-4.

FIG. 10 shows FR-Raman spectrum analysis results of Experimental Example 1-4. In FIG. 10, b1, b2, and b3 are analysis results of Experimental Example 1-2, Experimental Example 1-3, and Experimental Example 1-4.

Referring to FIG. 10, in the FR-Raman spectrum of the organic light-emitting composite of Experimental Example 1-4 (b3), PTZ peaks were observed at 345 cm$^{-1}$ and 1033 cm$^{-1}$. At 1336 cm$^{-1}$, 1357 cm$^{-1}$, and 1612 cm$^{-1}$, the peaks of PTZ cation radical were observed. At 447 cm$^{-1}$, and 1054 cm$^{-1}$, the peaks of PTZ dication were observed. From the results, it could be confirmed that the radical cation of PTZ and the dication of PTZ were formed in the organic light-emitting composite of Experimental Example 1-4.

Figure 11A:
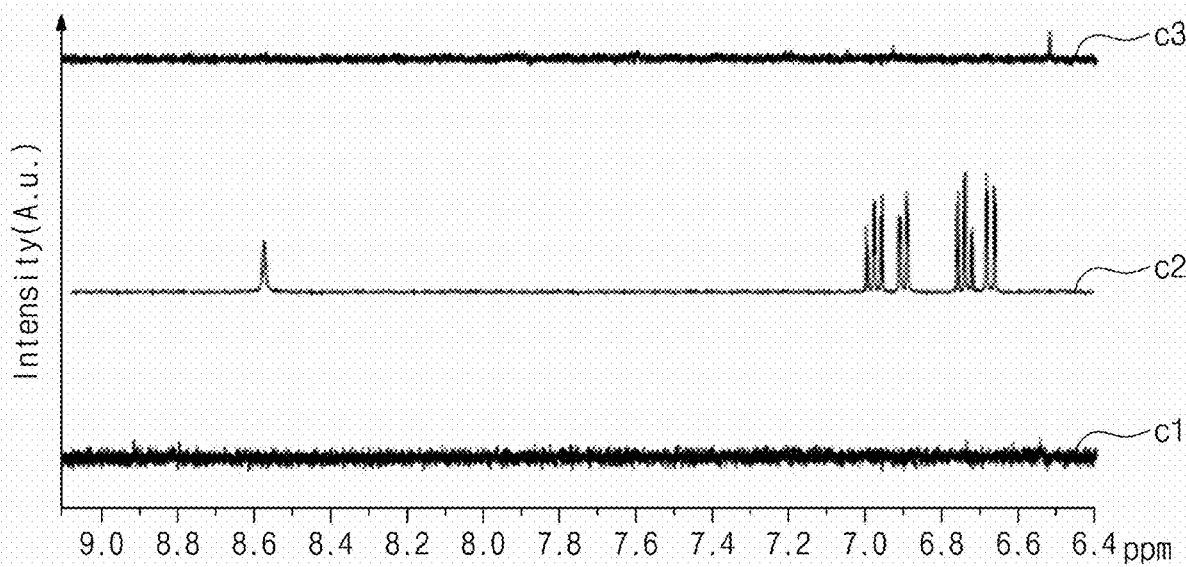
FIG. 11A shows $^1$H-NMR analysis results of Experimental Example 1-2, a crystallized light-emitting material, and Experimental Example 1-4.

FIG. 11A shows $^1$H-NMR analysis results of Experimental Example 1-2, a crystallized light-emitting material, and Experimental Example 1-4. In FIG. 11A, c1, c2, and c3 represent 1H-NMR analysis results of a PDMS matrix (Experimental Example 1-2), crystallized PTZ, and Experimental Example 1-3, respectively.

Referring to FIG. 11A, it could be found that the preliminary composite of Experimental Example 1-3 is composed of a single light-emitting material. In this case, the single light-emitting material may include neutral PTZ, the radical cation of PTZ, and the dication of PTZ.

Figure 11B:
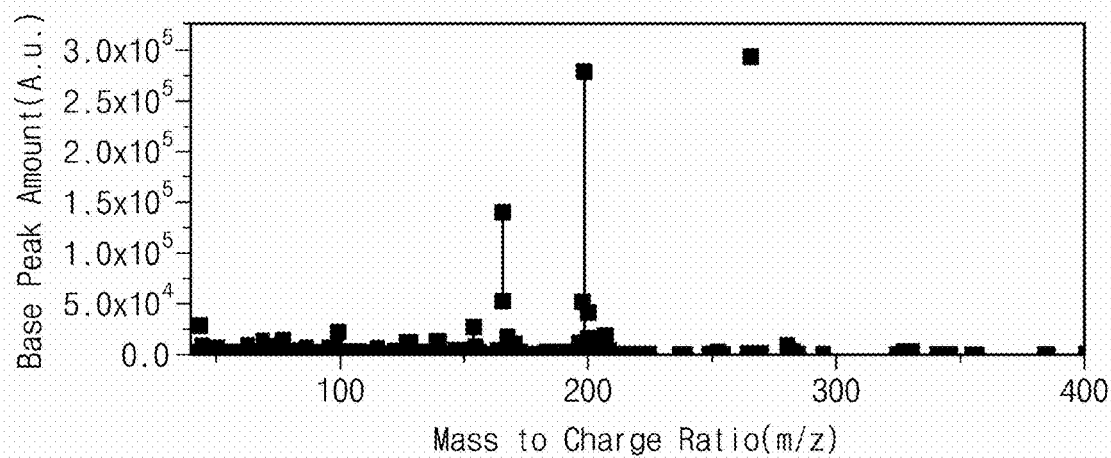
FIG. 11B shows gas chromatography mass spectrometry results of Experimental Example 1-4.

FIG. 11B shows gas chromatography mass spectrometry results of Experimental Example 1-4.

Referring to FIG. 11B, it could be observed that the light-emitting material composite is composed of a single light-emitting material with m/z of 199. The single light-emitting material may include neutral PTZ, the radical cation of PTZ, and the dication of PTZ.

Figure 12A:
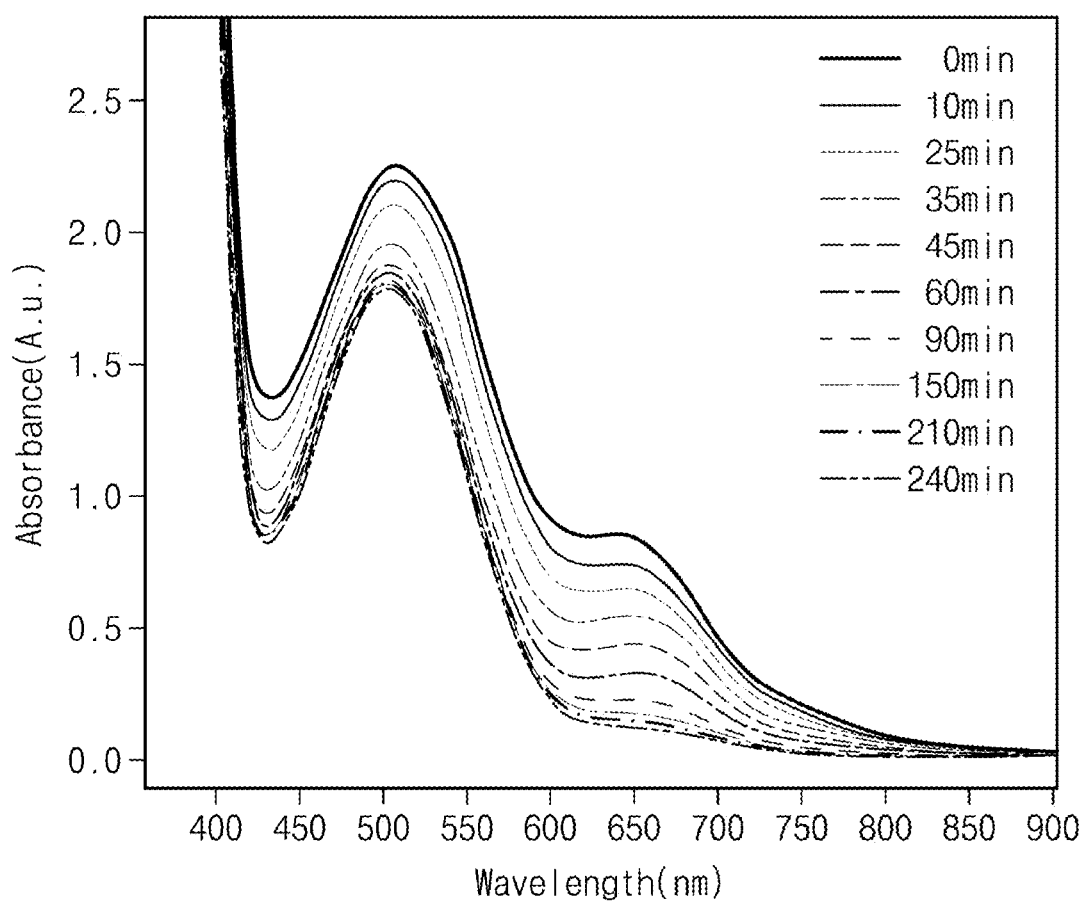
FIG. 12A shows measurement results on the peak change of PTZ radical cations dissolved in ethanol according to time.
Figure 12B:
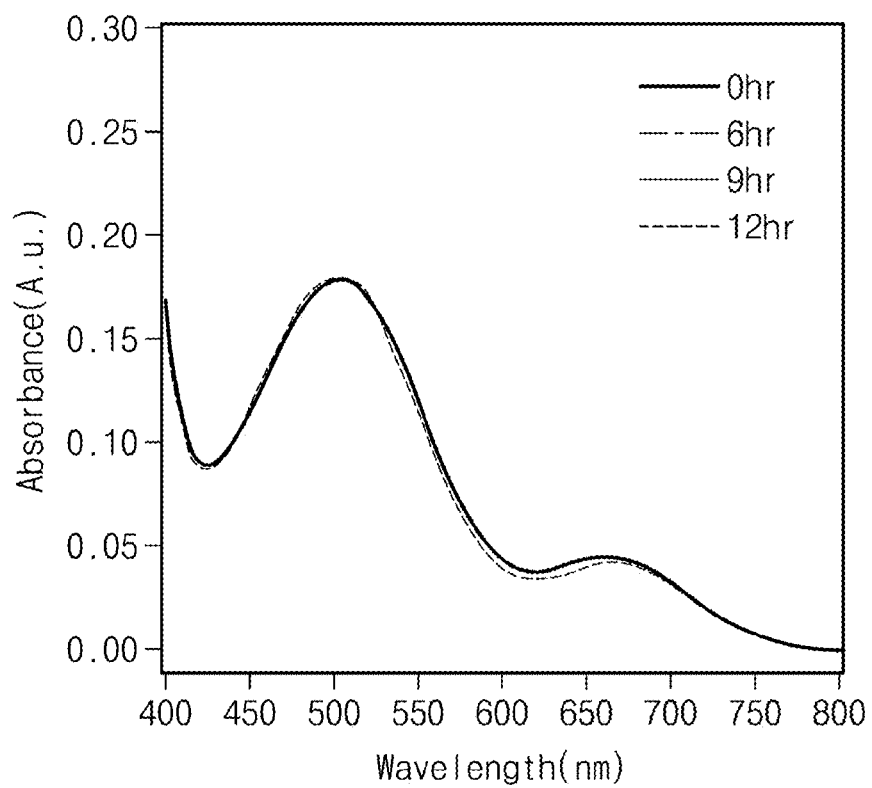
FIG. 12B shows measurement results on the peak change of light-emitting material radical cation in the organic light-emitting composite of Experimental Example 1-4 according to time.

FIG. 12A shows measurement results on the peak change of PTZ radical cations dissolved in ethanol according to time. FIG. 12B shows measurement results on the peak change of light-emitting material radical cation in the organic light-emitting composite of Experimental Example 1-4 according to time. In FIG. 12A and FIG. 12B, absorbance change was measured after finishing the UV irradiation.

As in FIG. 12A, the light-emitting material (PTZ) dissolved in ethanol showed peak change according to time. Referring to FIG. 12B, the light-emitting material (PTZ) of the organic light-emitting composite did not show peak change according to time. The PTZ radical cations of Experimental Example 1-4 are provided in the cavities of the polymer matrix. From the results, it could be found that the polymer matrix stabilizes the oxidized light-emitting material.

Figure 13:
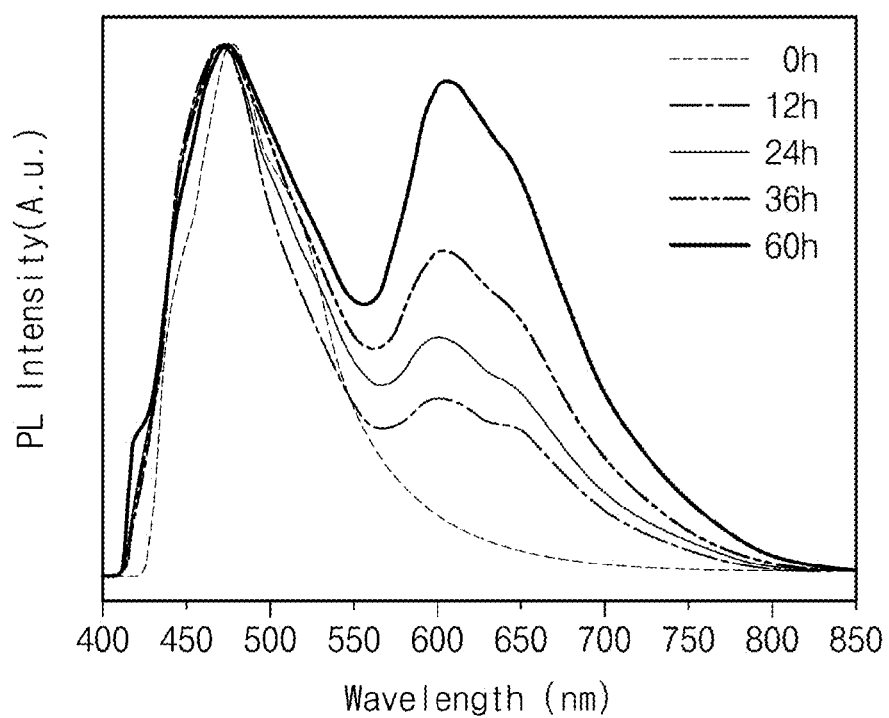
FIG. 13 shows measurement results on photoluminescence according to UV irradiation time of the organic light-emitting composite of Experimental Example 1-4.

FIG. 13 shows measurement results on photoluminescence (hereinafter, PL) according to UV irradiation time of the organic light-emitting composite of Experimental Example 1-4.

Referring to FIG. 13, if the UV irradiation time increases, the intensity of photoluminescence at 500 nm to 800 nm increases. The peaks of 500 nm to 800 nm correspond to PTZ radical cation and PTZ dication. The photoluminescence of 450 nm corresponds to the peak of single crystalline PTZ.

Table 4 shows measurement results of CIE color coordinate according to the UV irradiation time of the organic light-emitting composite of Experimental Example 1-4.

TABLE 4

| UV irradiation time (hr) | CIE color coordinate |
|---|---|
| 0 | (0.177, 0.143) |
| 12 | (0.258, 0.272) |
| 24 | (0.282, 0.297) |
| 36 | (0.306, 0.314) |
| 60 | (0.345, 0.326) |

Referring to Table 4, according to the change of UV irradiation time, the CIE color coordinate of light emitted by the organic light-emitting composite is changed. If the UV irradiation time is 60 hours, the CIE color coordinate of light emitted by the organic light-emitting composite closes to white light.

The above description of the present invention is to be considered illustrative, and not restrictive, and may be used in various other combinations, modifications and environments only within the gist of the present invention. The appended claims should be interpreted to include other embodiments.

The invention claimed is:

1. An organic light-emitting composite, comprising:
a polymer matrix; the polymer matrix comprises a polymer containing a silicon atom, and
a first light-emitting material provided in the polymer matrix; the first light-emitting material is represented by the following Formula 1:

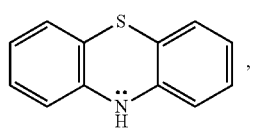

[Formula 1]

, and
a second light-emitting material provided in the polymer matrix and obtained by oxidizing the first light-emitting material,
wherein the second light-emitting material has the same molecular weight as that of the first light-emitting material.

2. The organic light-emitting composite according to claim 1, wherein the second light-emitting material comprises at least one among a radical cation of the first light-emitting material and a dication of the first light-emitting material.

3. The organic light-emitting composite according to claim 2, wherein
the first light-emitting material emits light of a first wavelength,
the radical cation of the first light-emitting material emits light of a second wavelength which is different from the first wavelength, and
the dication of the first light-emitting material emits light of a third wavelength which is different from the first wavelength and the second wavelength.

4. The organic light-emitting composite according to claim 2, wherein the first light-emitting material has a neutral state.

5. The organic light-emitting composite according to claim 1, wherein
the polymer matrix comprises cavities therein, and
the first light-emitting material and the second light-emitting material are provided in the cavities of the polymer matrix.

6. A method of manufacturing the (an) organic light-emitting composite of claim 1, the method comprising:
preparing the (a) polymer matrix comprising cavities;
supplying the first light-emitting material(s) on the polymer matrix for the inflow of the first light-emitting material(s) into the cavities of the polymer matrix; and
oxidizing some of the first light-emitting material(s) by irradiating light on the polymer matrix.

7. The method of manufacturing an organic light-emitting composite according to claim 6, wherein the oxidizing some of the first light-emitting material comprises forming at least one among radical cations of the first light-emitting material and dications of the first light-emitting material.

8. The method of manufacturing an organic light-emitting composite according to claim 7, wherein
the radical cations of the first light-emitting material emit light having a wavelength different from that of the first light-emitting material, and
the dications of the first light-emitting material emit light having a wavelength different from those of the radical cations of the first light-emitting material and that of the first light-emitting material.

9. The method of manufacturing an organic light-emitting composite according to claim 6, wherein another some of the first light-emitting material is non-oxidized after the irradiating light on the first light-emitting material.

10. The method of manufacturing an organic light-emitting composite according to claim 6, wherein the irradiating light on the first light-emitting material is performed in the presence of an oxygen gas.

11. The method of manufacturing an organic light-emitting composite according to claim 6, wherein
the polymer matrix comprises a silicon atom, and
the first light-emitting material comprises phenothiazine.

12. The method of manufacturing an organic light-emitting composite according to claim 6, wherein the supplying of the first light-emitting material comprises physical contact of the first light-emitting material with the polymer matrix.

13. The method of manufacturing an organic light-emitting composite according to claim 6, wherein
- the supplying of the first light-emitting material on the polymer matrix comprises supplying a disc containing the first light-emitting material in a single crystalline state on the polymer matrix, and
- the first light-emitting material flows into the cavities of the polymer matrix as individual single molecules.

* * * * *